(12) United States Patent
Akahane

(10) Patent No.: US 10,809,285 B2
(45) Date of Patent: Oct. 20, 2020

(54) CURRENT DETECTION CIRCUIT AND CURRENT DETECTION METHOD OF SEMICONDUCTOR ELEMENT

(71) Applicant: FUJI ELECTRIC CO., LTD., Kawasaki-shi (JP)

(72) Inventor: Masashi Akahane, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 37 days.

(21) Appl. No.: 16/170,486

(22) Filed: Oct. 25, 2018

(65) Prior Publication Data
US 2019/0187190 A1 Jun. 20, 2019

(30) Foreign Application Priority Data
Dec. 20, 2017 (JP) .................................. 2017-243386

(51) Int. Cl.
| | |
|---|---|
| G01R 19/165 | (2006.01) |
| H02M 1/08 | (2006.01) |
| H02H 1/00 | (2006.01) |
| H03K 17/082 | (2006.01) |
| H02M 1/32 | (2007.01) |
| H02M 1/00 | (2006.01) |

(52) U.S. Cl.
CPC ..... G01R 19/16571 (2013.01); H02H 1/0007 (2013.01); H02M 1/08 (2013.01); H02M 1/32 (2013.01); H03K 17/0828 (2013.01); *H02M 2001/0009* (2013.01); *H03K 2217/0027* (2013.01)

(58) Field of Classification Search
CPC ......... G01R 19/16571; H03K 17/0828; H03K 2217/0027; H02M 1/32; H02M 1/08; H02M 2001/0009; H02H 1/0007; H02H 7/12; H02H 7/222
See application file for complete search history.

(56) References Cited

U.S. PATENT DOCUMENTS 5,375,029 A * 12/1994 Fukunaga ............... G05F 1/573
323/285

FOREIGN PATENT DOCUMENTS

| JP | 5-276761 A | 10/1993 |
|---|---|---|
| JP | 6-120787 A | 4/1994 |
| JP | 2006-32393 A | 2/2006 |
| JP | 2015-53749 A | 3/2015 |

(Continued)

*Primary Examiner* — Farhana A Hoque

(57) ABSTRACT

A current detection circuit includes: a current detection unit configured to detect a potential difference between both ends of a first current detection resistor interposed between a control terminal and a drive circuit of a voltage-controlled semiconductor element including a current detection terminal; a voltage detection unit configured to detect a voltage at one of the both ends of the first current detection resistor; a voltage determination unit configured to determine whether or not a detection voltage of the voltage detection unit is not less than a threshold voltage; a voltage level adjustment unit configured to adjust a voltage level of a current detection voltage of the current detection terminal by a logical product signal of a current detection signal and a voltage determination signal; and an overcurrent detection unit configured to output an overcurrent detection signal when the adjusted current detection voltage is not less than a threshold voltage.

16 Claims, 8 Drawing Sheets

(56) References Cited

FOREIGN PATENT DOCUMENTS

| JP | 2015-139271 A | 7/2015 |
|----|---------------|--------|
| JP | 2017-63265 A  | 3/2017 |

\* cited by examiner

CURRENT DETECTION CIRCUIT AND CURRENT DETECTION METHOD OF SEMICONDUCTOR ELEMENT

CROSS REFERENCE TO RELATED APPLICATIONS AND INCORPORATION BY REFERENCE

This application claims benefit of priority under 35 USC 119 based on Japanese Patent Application No. 2017-243386 filed on Dec. 20, 2017, the entire contents of which are incorporated by reference herein.

TECHNICAL FIELD

The present invention relates to a current detection circuit and a current detection method of a voltage-controlled semiconductor element including a current detection terminal.

BACKGROUND ART

Voltage-controlled semiconductor elements such as field effect transistors (FETs) and insulated gate bipolar transistors (IGBT) are used for half-bridge drive circuits or the like of consumer and industrial power conversion devices and the like.

The voltage-controlled semiconductor elements include a current detection terminal (a sense terminal) configured to output a current corresponding to the amount of a current flowing through the elements themselves in order to achieve a self-protection function against overcurrent. The current output from the current detection terminal is monitored to detect an overcurrent state, thereby enabling the overcurrent protection function to be achieved.

As an example of such an overcurrent protection circuit, there has been proposed an overcurrent protection circuit of a power device disclosed in JP H06-120787 A.

The overcurrent protection circuit protects an IGBT incorporating a current detection terminal from overcurrent. In the IGBT, a current proportional to collector current flows to a current sense terminal. A current detection resistor is connected between the current sense terminal and ground to supply a voltage drop value of the current detection resistor to a non-inverting input terminal of a protection comparator. A reference voltage is supplied to an inverting input terminal of the protection comparator, and when the voltage drop value exceeds the reference voltage, a driver connected to the gate of the IGBT is put into an inactive state to achieve an overcurrent protection function.

In this case, the reference voltage input to the inverting input terminal of the protection comparator is switched to two levels: high and low. In switching the reference voltage, a gate voltage between the driver and the gate terminal of the IGBT is compared by a voltage monitor comparator, and the comparison output of the voltage monitor comparator is input to a controller to which an input signal to the driver is supplied (for example, FIG. 3 and paragraphs [0046] to [0060] of JP H06-120787 A).

The controller is triggered by the rising edge of the input signal input to the driver to output a control signal for instructing connection to a reference voltage higher than a steady reference voltage to an analog switch only during a transient state estimated period T, which is regarded as a transient period immediately after turn on. Additionally, the controller regards periods other than the transient state estimated period T as steady state periods, and outputs a control signal for instructing connection to the steady reference voltage to the analog switch. Accordingly, the controller serves as a kind of timer for determining the transient state estimated period T.

Note that the transient state estimated period T of the controller is a period from the rising of the input signal to a time point when the gate voltage exceeds a reference voltage VREF3, and the output of the voltage detection comparator rises to high level.

SUMMARY OF INVENTION

Incidentally, in the related art disclosed in JP H06-120787 A described above, a starting condition for the transient state estimated period T is a time point when the input signal rises, and an ending condition for the transient state estimated period is set to a time point when the output of the voltage detection comparator rises to high level, i.e., a time point when the gate voltage exceeds the reference voltage VREF3. Due to this, in an actual period other than the transient state estimated period, noise superimposed on the input signal may be erroneously detected, resulting in starting of the transient state estimated period T. In this case, a reference voltage higher than in steady state is selected. Accordingly, when the transient state estimated period T is started after the IGBT is turned on, overcurrent protection cannot be performed normally. As used herein, examples of the type of the noise include noises that occur in fields, such as thunder surges, ESD surges, and radiated electromagnetic noises.

Accordingly, the present invention has been made by focusing attention on the problem of the conventional technology. It is an object of the present invention to provide a current detection circuit and a current detection method of a semiconductor element configured so that a starting condition for a transient state estimated period is not affected by noise.

In order to achieve the object mentioned above, according to an aspect of the present invention, there is provided a current detection circuit of a semiconductor element including: a current detection unit configured to detect a potential difference between both ends of a first current detection resistor, the first current detection resistor being interposed between a control terminal of a voltage-controlled semiconductor element and a drive circuit, the voltage-controlled semiconductor element including a current detection terminal; a voltage detection unit configured to detect a voltage at one of the both ends of the first current detection resistor; a voltage determination unit configured to determine whether or not a detection voltage output from the voltage detection unit is equal to or more than a first threshold voltage; a voltage level adjustment unit configured to adjust a voltage level of a current detection voltage of the current detection terminal by a logical product signal of at least a current detection signal of the current detection unit and a voltage determination signal of the voltage determination unit; and an overcurrent detection unit configured to output an overcurrent detection signal when the current detection voltage adjusted by the voltage level adjustment unit is equal to or more than a second threshold voltage.

According to another aspect of the present invention, there is provided a current detection method of a semiconductor element, including: detecting, by a current detection unit, a gate current flowing through a first current detection resistor interposed between a control terminal of a voltage-controlled semiconductor element and a drive circuit, the voltage-controlled semiconductor element including a current detection terminal, and detecting a gate voltage between the first current detection resistor and the control terminal by a voltage detection unit; and during a period from a time point when the gate current is detected up to a time point when the gate voltage exceeds a threshold value, suppressing a voltage level of a current detection signal output from the current detection terminal to suppress erroneous detection of an overcurrent.

According to the one aspect of the present invention, a transient state estimated period is started by detecting the gate current, and the transient state estimated period is ended at the time point when the gate voltage exceeds the threshold voltage. Thus, the transient state estimated period is not affected by noise of an input signal.

DESCRIPTION OF EMBODIMENTS

Next, with reference to the accompanying drawings, an embodiment according to the present invention will be described. In the following description of the drawings, the same or similar reference signs are assigned to the same or similar composing elements.

In addition, the embodiment, which will be described below, indicate devices and methods to embody the technical idea of the present invention, and the technical idea of the present invention does not limit the materials, shapes, structures, arrangements, and the like of the constituent components to those described below. The technical idea of the present invention can be subjected to a variety of alterations within the technical scope prescribed by the claims.

Hereinafter, a first embodiment of a current detection circuit of a semiconductor element according to the present invention will be described with reference to the drawings.

First will be a description of a half-bridge circuit to which the present invention is applicable.

Figure 1:
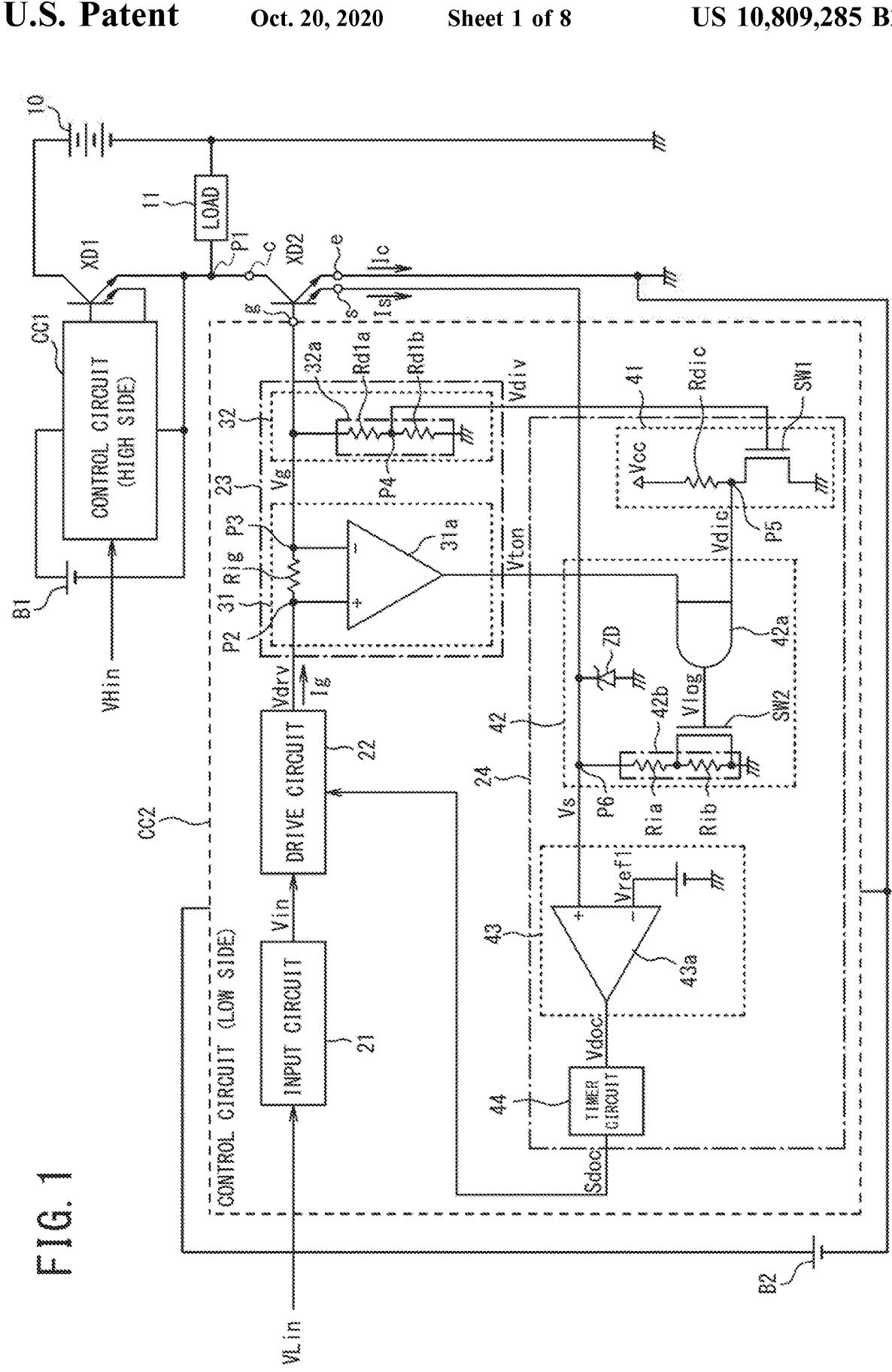
FIG. 1 is a circuit diagram illustrating a first embodiment of a current detection circuit of a semiconductor element according to the present invention.

In the half-bridge circuit of FIG. 1, a voltage-controlled semiconductor element XD1 on a high side (a high potential side) and a voltage-controlled semiconductor element XD2 on a low side (a low potential side) are totem-pole connected in series to a DC power supply 10.

Examples of the high-side voltage-controlled semiconductor element XD1 to be used include an N-channel or P-channel MOSFET and a P-type or N-type insulated gate bipolar transistor (IGBT). Examples of the low-side voltage-controlled semiconductor element XD2 to be used include an N-channel MOSFET and an N-type insulated gate bipolar transistor.

Herein, as the voltage-controlled semiconductor elements XD1 and XD2, N-type insulated gate bipolar transistors (IGBTs) are applied. The voltage-controlled semiconductor elements XD1 and XD2 include a collector terminal c on a high potential side and an emitter terminal e on a low potential side, a gate terminal g as a control terminal, and a current detection terminal (a sense terminal) s. The current detection terminal s outputs a sense current Is proportional to a collector current Ic flowing between the collector terminal c and the emitter terminal e.

Unillustrated free wheeling diodes D1 and D2 are individually connected in reverse parallel to the voltage-controlled semiconductor elements XD1 and XD2. The free wheeling diodes D1 and D2 may be parasitic diodes or external diodes.

Additionally, for example, an inductive load 11 is connected between a connection point P1 between the voltage-controlled semiconductor elements XD1 and XD2 and a negative electrode side of the DC power supply 10. The load 11 is driven by power output from the connection point P1.

A high side control circuit CC1 is connected to the gate terminal g of the voltage-controlled semiconductor element XD1. The control circuit CC1 is driven by an external power supply B1, and forms a gate signal for driving the voltage-controlled semiconductor element XD1 on a basis of a high side drive signal VHin, which is an input pulse having sloped rising and falling edges. The control circuit CC1 outputs the gate signal to the gate terminal of the voltage-controlled semiconductor element XD1 to control on and off of the voltage-controlled semiconductor element XD1.

Similarly, a low side control circuit CC2 is connected to the gate terminal g of the voltage-controlled semiconductor element XD2. The control circuit CC2 is also driven by an external power supply B2. The control circuit CC2 includes an input circuit 21, a drive circuit 22, a gate current/voltage detection unit 23, and a sense current detection circuit 24 as a current detection circuit.

As illustrated in FIGS. 2A to 2J, the input circuit 21 compares a pulsed low side drive signal VLin having sloped rising and falling edges with a threshold voltage Vth1, and forms an input signal Vin having a rectangular waveform that goes into an off-state (low level) when the low side drive signal VLin is equal to or less than the threshold voltage Vth1, and that goes into an on-state (high level) when the low side drive signal VLin is more than the threshold voltage Vth1. Furthermore, a noise filter function is included to remove a minute noise pulse or the like input to the low side drive signal VLin.

The drive circuit 22 outputs a drive signal drv that goes into an on-state after a predetermined time delay when the input signal Vin is input and then changes from an off-state to an on-state, and that goes into an off-state after a predetermined time delay when the input signal Vin goes from the on-state into the off-state. Note that the operation of the predetermined time delay includes a function for adjusting a signal transmission delay time from the low side drive signal VLin to the low side output terminal (gate terminal) g.

The gate current/voltage detection unit 23 includes a current detection unit 31 and a voltage detection unit 32. The current detection unit 31 includes a first current detection resistor Rig and a current detection comparator 31a. The first current detection resistor Rig has one end connected to the drive circuit 22, and the other end connected to the gate terminal g of the voltage-controlled semiconductor element XD2.

The current detection comparator 31a has a non-inverting input terminal connected to a connection point P2 between the drive circuit 22 and the first current detection resistor Rig and an inverting input terminal connected to a connection point P3 between the first current detection resistor Rig and the gate terminal g of the voltage-controlled semiconductor element XD2. The current detection comparator 31a detects a gate current Ig by a potential difference between a drive voltage Vdrv that is a voltage of the drive circuit 22 side of the first current detection resistor Rig generated when the gate current Ig passes through the first current detection resistor Rig and a gate voltage Vg that is a voltage of the voltage-controlled semiconductor element XD2 side of the first current detection resistor Rig. Specifically, the current detection comparator 31a outputs a low level current detection signal Vton when there is no potential difference between both ends of the first current detection resistor Rig or when the potential of the gate voltage Vg is higher than the potential of the drive voltage Vdrv. In addition, the current detection comparator 31a outputs a high level current detection signal Vton when the potential of the drive voltage Vdrv is higher than the potential of the gate voltage Vg and there is a potential difference between both ends of the first current detection resistor Rig.

The voltage detection unit 32 is formed by a voltage divider circuit 32a connected between the gate terminal g of the voltage-controlled semiconductor element XD2 and ground. The voltage divider circuit 32a includes a first voltage divider resistor Rd1a and a second voltage divider resistor Rd1b connected in series, and a divided voltage Vdiv is output from a connection point P4 between the first voltage divider resistor Rd1a and the second voltage divider resistor Rd1b.

The sense current detection circuit 24 includes a voltage determination unit 41, a voltage level adjustment unit 42, an overcurrent detection unit 43, and a timer circuit 44.

The voltage determination unit 41 is formed by a series circuit including a resistor Rdic connected between a DC power supply Vcc and ground and a switch element SW1. Herein, the switch element SW1 is formed by, for example, an N-channel MOSFET. The divided voltage Vdiv output from the voltage divider circuit 32a is supplied to a gate terminal of the switch element SW1. Then, the voltage division ratio of the voltage divider circuit 32a is set so that when the gate voltage Vg applied to the gate terminal g of the voltage-controlled semiconductor element XD2 becomes a predetermined threshold voltage Vth2 (for example, 12V), the divided voltage Vdiv becomes a threshold voltage (a first threshold voltage) of the switch element SW1. Thus, when the gate voltage Vg exceeds the predetermined threshold voltage Vth2, the switch element SW1 is controlled into an on-state by the divided voltage Vdiv.

Additionally, the voltage determination unit 41 outputs a voltage determination signal Vdic from a connection point P5 between the resistor Rdic and the switch element SW1. The voltage determination signal Vdic goes to high level when the gate voltage Vg is equal to or less than the threshold voltage Vth2, since the switch element SW1 maintains an off-state. On the other hand, when the gate voltage Vg exceeds the threshold voltage Vth2, the switch element SW1 goes into the on-state, whereby the voltage determination signal Vdic is inverted to low level.

The voltage level adjustment unit 42 includes a logical product circuit 42a, a second current detection resistor 42b connected between the current detection terminal s of the voltage-controlled semiconductor element XD2 and ground, and a switch element SW2 configured to adjust a resistance value of the second current detection resistor 42b. The sense current Is output from the current detection terminal s flows to the second current detection resistor 42b, so that the potential Vs of a connection point P6 between the second current detection resistor 42b and the current detection terminal s of the voltage-controlled semiconductor element XD2 is a product of the sense current Is and the resistance value of the second current detection resistor 42b.

The logical product circuit 42a has one input terminal receiving the current detection signal Vton output from the current detection comparator 31a of the current detection unit 31 and the other input terminal receiving the voltage determination signal Vdic output from the voltage determination unit 41. When the current detection signal Vton and the voltage determination signal Vdic are both at high level, a logical product signal Vlog at high level is output from the logical product circuit 42a.

The second current detection resistor 42b is formed by two resistors Ria and Rib connected in series. The switch element SW2 is connected in parallel with the resistor Rib. The switch element SW2 is formed by, for example, an N-channel MOSFET, and the logical product signal Vlog of the logical product circuit 42a is supplied to the gate terminal of the switch element SW2. In this manner, the resistance value of the second current detection resistor 42b and the potential Vs of the connection point P6 are adjusted by the logical product signal Vlog.

Thus, on a basis of the current detection signal Vton and the voltage determination signal Vdic, the current detection voltage Vs at the adjusted voltage level is output from the connection point P6 between the second current detection resistor 42b and the current detection terminal s of the voltage-controlled semiconductor element XD2. Note that an overvoltage protection Zener diode ZD is connected between ground and a portion between the current detection terminal s of the voltage-controlled semiconductor element XD2 and the connection point P6.

The overcurrent detection unit 43 includes an overcurrent determination comparator 43a. The overcurrent determination comparator 43a has a non-inverting input terminal receiving the current detection voltage Vs output from the voltage level adjustment unit 42 and an inverting input terminal receiving a reference voltage Vref1 (a second threshold voltage). Thus, the overcurrent determination comparator 43a outputs an overcurrent detection signal Vdoc at low level when the current detection voltage Vs is equal to or less than the reference voltage Vref1, and outputs the overcurrent detection signal Vdoc at high level when the current detection voltage Vs exceeds the reference voltage Vref1.

When the overcurrent detection signal Vdoc output from the overcurrent determination comparator 43a goes to high level, the timer circuit 44 is set to start counting of a transient state estimated period Tr, and the counting is ended after a predetermined time passes. When the high level state of the overcurrent detection signal Vdoc continues without intermission during a counting period Tm up to the ending, the timer circuit 44 outputs an overcurrent protection signal Sdoc at high level to the drive circuit 22 to control the drive circuit 22 into an inactive state.

Next, operation of the first embodiment will be described with reference to FIGS. 2A to 2J.

The high side control circuit CC1 and the low side control circuit CC2 receive a high side drive signal VHin and a low side drive signal VLin having mutually opposite phases and having a trapezoidal waveform, in which a dead time is provided to prevent the voltage-controlled semiconductor elements XD1 and XD2 from being turned on simultaneously.

Operations of the control circuits CC1 and CC2 that have received the high side drive signal VHin and the low side drive signal VLin are basically the same, and thus the operation of the control circuit CC2 will be described with reference to FIGS. 2A to 2J.

Figure 2:
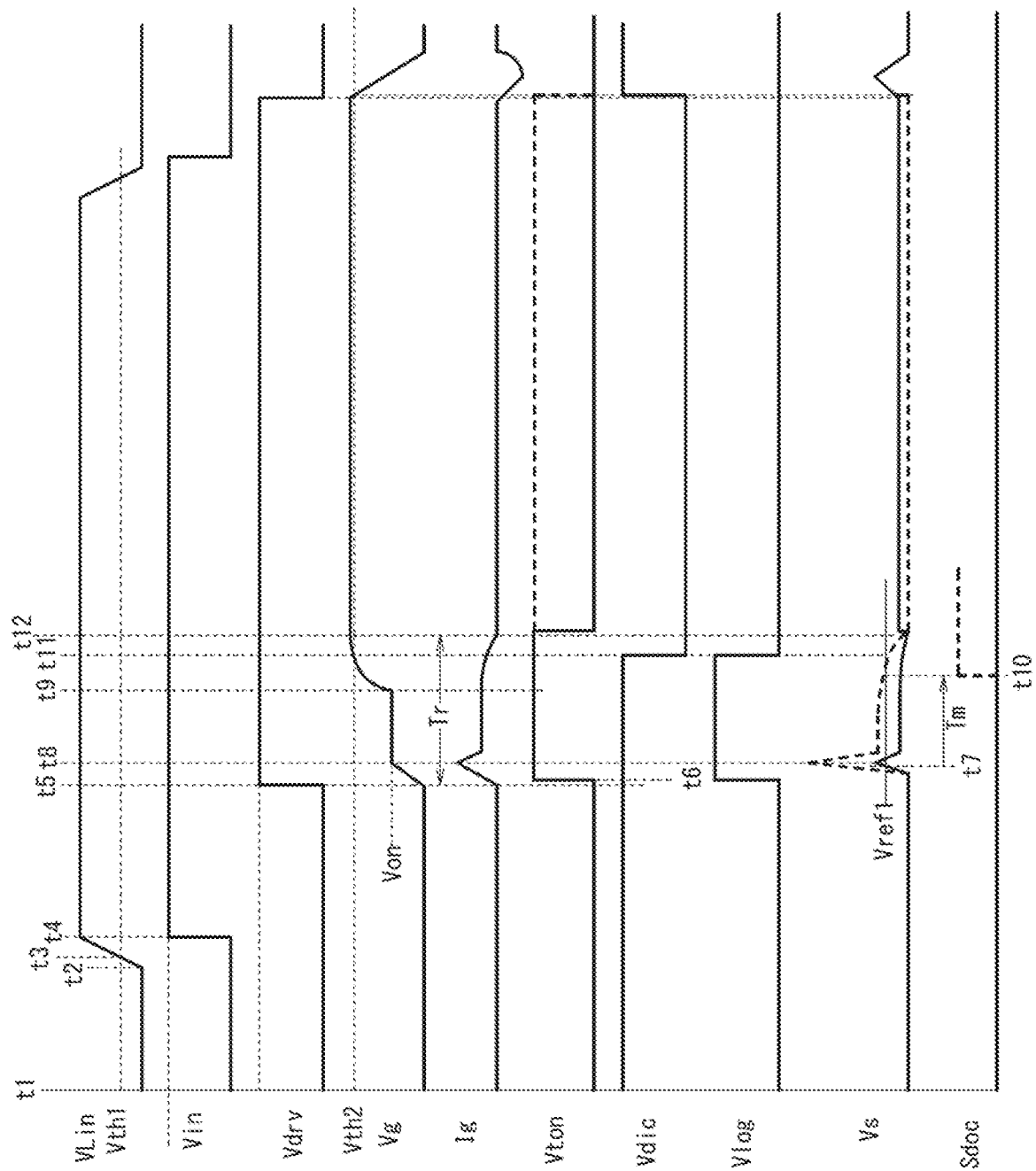
FIGS. 2A to 2J are signal waveform diagrams used for description of operation of the first embodiment.

Assume that, at a time point t1, the low side drive signal VLin input to the input circuit 21 is at low level, as illustrated in FIG. 2A. In this state, the input signal Vin output from the input circuit 21 is also at low level, as illustrated in FIG. 2B, and the drive voltage Vdrv output from the drive circuit 22 is also at low level.

Accordingly, the gate voltage Vg and the gate current Ig input to the gate terminal g of the voltage-controlled semiconductor element XD2 are also maintained at low level, as illustrated in FIGS. 2D and 2E, so that the voltage-controlled semiconductor element XD2 maintains an off-state.

In this case, since the gate current Ig does not flow to the first current detection resistor Rig, there is no potential difference between both ends thereof. Thus, the current detection signal Vton of the current detection comparator 31a of the current detection unit 31 also goes to low level, as illustrated in FIG. 2F, and the divided voltage Vdiv output from the voltage divider circuit 32a of the voltage detection unit 32 also goes to low level.

As a result, the switch element SW1 of the voltage determination unit 41 maintains the off-state, whereby the voltage determination signal Vdic is at high level, as illustrated in FIG. 2G.

Accordingly, since the current detection signal Vton of the current detection unit 31 is at low level, and the voltage determination signal Vdic of the voltage determination unit 41 is at high level, the logical product circuit 42a of the voltage level adjustment unit 42 outputs the logical product signal Vlog at low level, as illustrated in FIG. 2H. Due to this, the switch element SW2 maintains the off-state. Thus, if a detection current is output from the current detection terminal s when the voltage-controlled semiconductor element XD2 is in the on-state, a normal state occurs in which the resistors Ria and Rib of the second current detection resistor 42b are connected in series, and the voltage level of the current detection voltage Vs is high. However, since the voltage-controlled semiconductor element XD2 is in the off-state, no detection signal is output from the current detection terminal s, so that the current detection voltage Vs is maintained at low level, as illustrated in FIG. 2I.

Due to this, the overcurrent detection signal Vdoc of the overcurrent determination comparator 43a of the overcurrent detection unit 43 goes to low level, and thus the timer circuit 44 is not set, as a result of which the overcurrent protection signal Sdoc output from the timer circuit 44 is maintained at low level, as illustrated in FIG. 2J. Accordingly, the drive circuit 22 does not go into the inactive state.

After that, at a time point t2, the low side drive signal VLin starts to rise, and reaches the threshold voltage Vth1 at a time point t3. Then, at a time point t4 after a delay time due to the input circuit 21, the input signal Vin output from the input circuit 21 is inverted from low level to high level, as illustrated in FIG. 2B.

Then, when the drive voltage output from the drive circuit 22 goes to high level at a time point t5, the gate voltage Vg starts to increase, and the gate current Ig starts to flow, starting charging of a gate-emitter capacitance of the voltage-controlled semiconductor element XD2.

In this case, the flow of the gate current Ig to the first current detection resistor Rig causes a potential difference between both ends of the first current detection resistor Rig. Due to this, at a time point t6 slightly later than the time point t5, the potential difference between both ends of the first current detection resistor Rig becomes equal to or more than a set value, and the current detection signal Vton of the current detection comparator 31a of the current detection unit 31 is inverted from low level to high level.

The current detection signal Vton is input to the logical product circuit 42a. Since the voltage determination signal Vdic of the voltage determination unit 41 input to the logical product circuit 42a is maintained at high level, the logical product signal Vlog is inverted from low level to high level.

Thus, the switch element SW2 goes into the on-state, whereby the resistor Rib of the second current detection resistor 42b is bypassed by the switch element SW2, so that the resistance value of the second current detection resistor 42b is lowered, and voltage drop by the second current detection resistor 42b is reduced, leading to lowering of the voltage level of the current detection voltage Vs.

On the other hand, the gate voltage Vg increases to reach an on-voltage Von at a time point t8, and similarly, the gate current Ig also increases.

In response to the increase of the gate current Ig, current output from the current detection terminal s of the voltage-controlled semiconductor element XD2 also increases. However, since the resistance value of the second current detection resistor 42b is suppressed to a small value, the current detection voltage Vs is limited to a smaller voltage level indicated by a solid line than an actual voltage indicated by a broken line, as illustrated in FIG. 2I. However, although suppressed to the low voltage level, the current detection voltage Vs may exceed the reference voltage Vref1 at a time point t7 before a time point t8 when the current detection voltage Vs is at a peak value thereof, in a peak period of transient response at the time of the turn-on, which will be described later.

Thus, the overcurrent detection unit 43 outputs the overcurrent detection signal Vdoc at high level during a period in which the current detection voltage Vs is more than the reference voltage Vref1, whereby the timer circuit 44 is set to start time counting.

After that, when the gate voltage Vg reaches the on-voltage Von at the time point t8, the voltage-controlled semiconductor element XD2 is turned on, collector current flows, and a collector-emitter voltage is reduced. At this time, charging of a collector-gate capacitance of the voltage-controlled semiconductor element XD2 is started, and the gate voltage Vg is maintained at a constant value due to a mirror effect. The gate current Ig is reduced, and then becomes constant. The current output from the current detection terminal s is also reduced, and has a constant current value. The current detection voltage Vs is also reduced to a constant voltage lower than the reference voltage Vref1.

When the current detection voltage Vs is equal to or less than the reference voltage Vref1, the overcurrent detection signal Vdoc of the overcurrent determination comparator 43a of the overcurrent detection unit 43 returns to low level.

Since the period in which the current detection voltage Vs is equal to or more than the reference voltage Vref1 is equal to or less than the time counting period Tm set by the timer circuit 44, the overcurrent protection signal Sdoc output from the timer circuit 44 is maintained at low level, and the drive circuit 22 maintains an active state. Note that a time point t10 indicates a time point when the time counting period Tm has passed from the time point t7. Additionally, the broken line indicates the current detection voltage Vs when the switch element SW2 is in the off-state. If the state in which the current detection voltage Vs is equal to or more than the reference voltage Vref1 continues until the time point t10, as indicated by the broken line, the overcurrent protection signal Sdoc goes to high level at the time point t10.

After that, at a time point t9, the gate voltage Vg starts again to increase, whereas the gate current Ig starts to reduce.

Then, at a time point t11, when the gate voltage Vg reaches the threshold voltage Vth2, the divided voltage Vdiv output from the voltage divider circuit 32a of the voltage detection unit 32 reaches a voltage that turns on the switch element SW1 of the voltage determination unit 41, so that the switch element SW1 is turned on. Thus, the voltage determination signal Vdic output from the voltage determination unit 41 goes to low level.

As a result, the logical product signal Vlog of the logical product circuit 42a of the voltage level adjustment unit 42 is inverted to low level, as indicated in FIG. 2H. This turns off the switch element SW2, whereby the resistance value of the second current detection resistor 42b returns from a low resistance value to a normal value, so that the voltage level of the current detection voltage Vs returns to the normal state.

At the time point t11, since the current detection voltage Vs set to high voltage level is lower than the reference voltage Vref1, the overcurrent detection signal Vdoc of the overcurrent determination comparator 43a does not go to high level, and also the timer circuit 44 is not set.

After that, at a time point t12, when the gate voltage Vg reaches a saturated state in which the Vg is equal to the drive voltage Vdrv, the gate current Ig also goes to zero. Due to this, there occurs no potential difference between both ends of the first current detection resistor Rig, so that the current detection signal Vton of the current detection comparator 31a of the current detection unit 31 goes to low level, as illustrated in FIG. 2F.

Then, after the gate voltage Vg is saturated, no gate current Ig flows. Accordingly, it does not occur that the voltage level of the current detection voltage Vs is reduced due to an erroneous determination that it is the transient state. Thus, when an overcurrent state or short circuit actually occurs, the voltage level of the current detection voltage Vs becomes high, so that the overcurrent detection signal Vdoc of the overcurrent determination comparator 43a goes to high level, and the timer circuit 44 starts time counting. Due to this, when the overcurrent state continues for a setting time of the timer circuit 44 or longer, the timer circuit 44 outputs the overcurrent protection signal Sdoc at high level to the drive circuit 22. As a result, the drive circuit 22 goes from the active state into the inactive state, whereby the drive voltage Vdrv is suppressed or stopped, which enables avoidance of the overcurrent state.

After that, the low side drive signal VLin changes from high level to low level, and, in response to this, the input signal Vin output from the input circuit 21 is inverted from high level to low level.

In response to this, the drive circuit 22 is operated to be turned off, and the drive voltage Vdrv of the drive circuit 22 is inverted from high level to low level (a reference potential) after a predetermined time delay from the input signal Vin, and the gate voltage Vg is gradually reduced to the reference potential.

Simultaneously with this, the parasitic capacitance of the voltage-controlled semiconductor element XD2 is discharged through the first current detection resistor Rig and the drive circuit 22 to increase the gate current Ig negatively. Then, the gate current Ig returns to zero at a time point when the gate voltage Vg reaches the reference potential.

Note that when the gate voltage Vg is reduced to equal to or less than the threshold voltage Vth2, the divided voltage Vdiv of the voltage divider circuit 32a of the voltage detection unit 32 is reduced to equal to or less than the threshold voltage of the switch element SW1, whereby the switch element SW1 of the voltage determination unit 41 is turned off. As a result, the voltage determination signal Vdic of the voltage determination unit 41 returns to high level.

In this case, in the current detection unit 31, the direction of the gate current Ig becomes opposite (a negative direction), so that the potential difference occurring between both ends of the first current detection resistor Rig becomes opposite to the turn-on situation, that is, the gate voltage Vg becomes higher than the drive voltage Vdrv. Accordingly, the current detection signal Vton of the current detection comparator 31a is maintained at low level, and the logical product signal Vlog of the logical product circuit 42a is also maintained at low level.

In this manner, in the present embodiment, the current detection unit 31 detects the gate current Ig, and the voltage detection unit 32 detects the gate voltage Vg. Then, the start of the transient state estimated period Tr from the time point t5 up to the time point t12 is detected by the gate current Ig, and the ending of the transient state estimated period Tr is detected when the gate voltage Vg reaches the threshold voltage Vth2. During the transient state estimated period Tr, the voltage level adjustment unit 42 suppresses the current detection voltage Vs to low voltage level in a transient state after the voltage-controlled semiconductor element XD2 is turned on.

In the transient state, the waveform of the current detection voltage Vs when the switch element SW1 remains off may represent a transient response in which the period in which the voltage Vs has a high peak value and also is equal to or more than the reference voltage Vref1 continues for the time counting period Tm set by the timer circuit 44 or longer, as illustrated by FIG. 2I. The reason for the transient response is that a transient current flow to the current detection terminal s due to influence of a change rate dV/dt of the gate voltage Vg input to the gate terminal g of the voltage-controlled semiconductor element XD2 and the parasitic capacitance of the voltage-controlled semiconductor element XD2, wiring inductance of the modules, and the like.

However, in the first embodiment, even when the period in which the current detection voltage Vs has a high peak value and is equal to or more than the reference voltage Vref1 is equal to or longer than the time counting period Tm set by the timer circuit 44, as illustrated by the broken line in FIG. 2I, reducing the voltage level can shorten the period in which the voltage Vs is equal to or more than the reference voltage Vref1 to only the peak time. Accordingly, in the transient state after the voltage-controlled semiconductor element XD2 is turned on, erroneous detection of an overcurrent state can be prevented.

Moreover, the start of the transient state estimated period Tr is detected by whether the gate current Ig is flowing or not. Thus, even when noise such as a thunder surge, an EDS surge, or radiated electromagnetic noise is superimposed on the low side drive signal VLin, no transient state is detected unless any gate current Ig flows. Thus, erroneous detection of an overcurrent state due to noise influence can be prevented.

Figure 3:
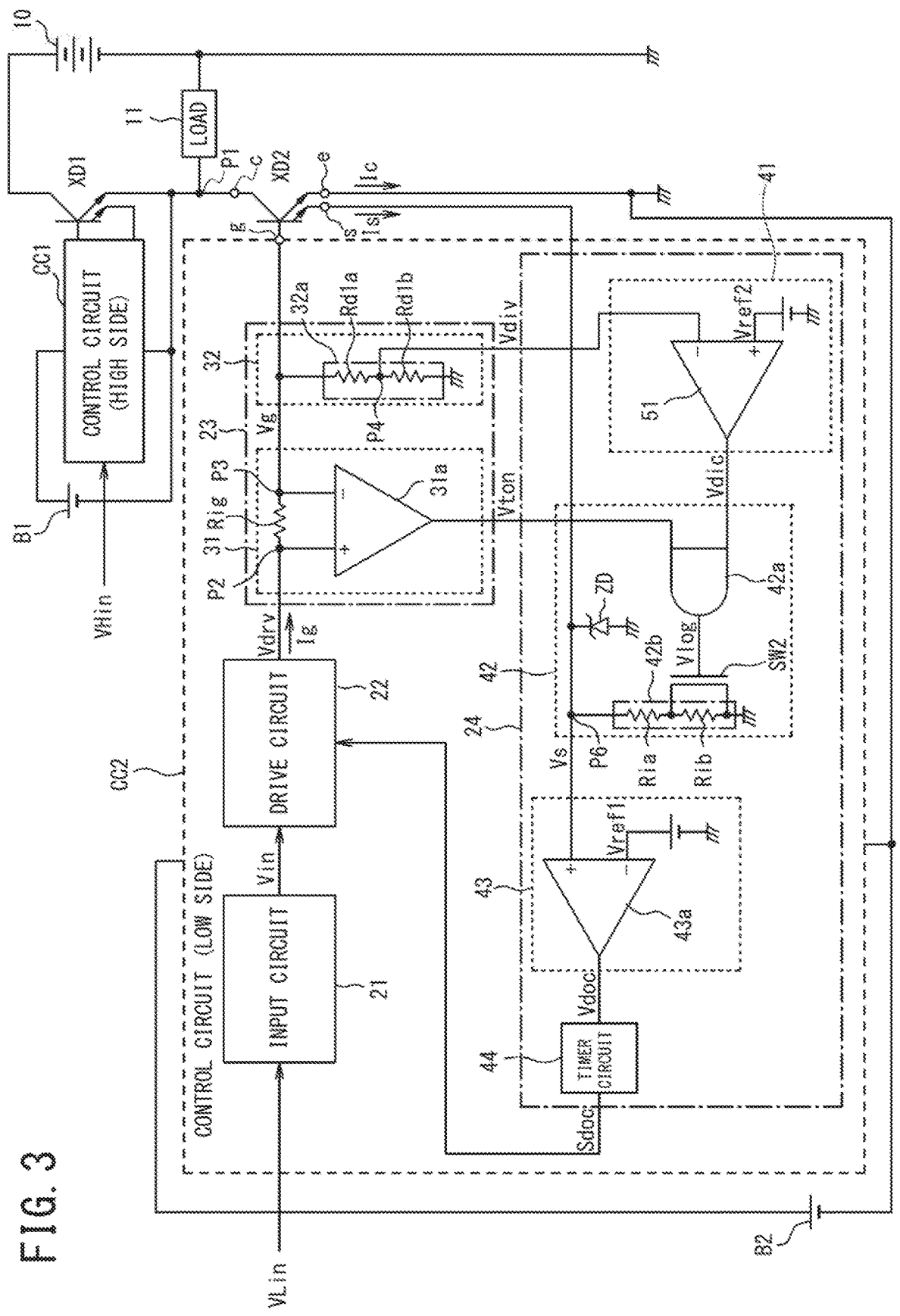
FIG. 3 is a circuit diagram illustrating a modification of the first embodiment of the current detection circuit of the semiconductor element according to the invention.

Note that the above first embodiment has described the case in which the voltage determination unit 41 is formed by the resistor Rdic and the switch element SW1. However, the voltage determination unit 41 is not limited to the structure, and may be formed as illustrated in FIG. 3.

Specifically, as the voltage determination unit 41, a voltage determination comparator 51 may be applied that is configured to compare the divided voltage Vdiv of the voltage divider circuit 32a with the reference voltage Vref2 (the first threshold voltage that is corresponding to a divided voltage at a time point when the gate voltage Vg reaches, for example, 12V).

In this case, the divided voltage Vdiv is input to an inverting terminal of the voltage determination comparator 51, and the reference voltage Vref2 is input to a non-inverting terminal thereof. In this manner, the voltage determination comparator 51 outputs, to the voltage level adjustment unit 42, the voltage determination signal Vdic at high level when the divided voltage Vdiv is equal to or less than the reference voltage Vref2, and the voltage determination signal Vdic at low level when the divided voltage Vdiv exceeds the reference voltage Vref2.

Accordingly, the same voltage determination signal Vdic as in the first embodiment described above can be produced by the voltage determination comparator 51.

Next, a second embodiment of the present invention will be described with reference to FIG. 4 and FIGS. 5A to 5K.

In the second embodiment, some changes are made in the voltage level adjustment unit 42.

Figure 4:
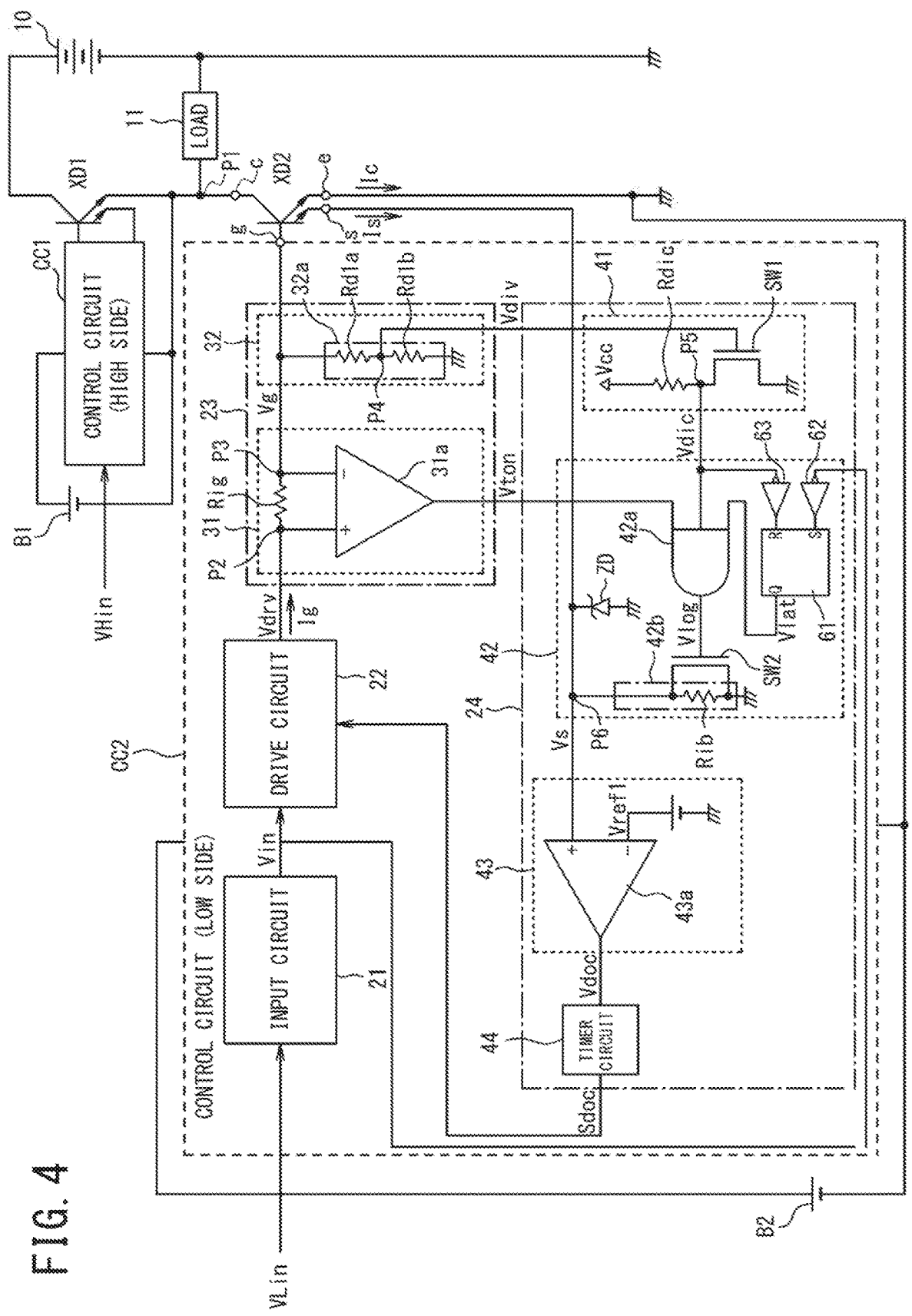
FIG. 4 is a circuit diagram illustrating a second embodiment of the current detection circuit of the semiconductor element according to the invention.

Specifically, in the second embodiment, an RS latch circuit (flip-flop) 61 is added to the voltage level adjustment unit 42 in the first embodiment, the resistor Ria is omitted, and furthermore, the logical product circuit 42a is changed to a three-input type, as illustrated in FIG. 4. The other structures are the same as those in the first embodiment. Elements corresponding to those of FIG. 1 are denoted by the same reference signs, and detailed description thereof will be omitted.

Herein, the RS latch circuit 61 has a set terminal S receiving the input signal Vin output from the input circuit 21 via a NOT circuit 62 and a reset terminal R receiving the voltage determination signal Vdic of the voltage determination unit 41 via a NOT circuit 63. A latch output Vlat output from an output terminal Q of the RS latch circuit 61, as with the current detection signal Vton of the current detection unit 31 and the voltage determination signal Vdic of the voltage determination unit 41, is input to an input terminal of the logical product circuit 42a.

Figure 5:
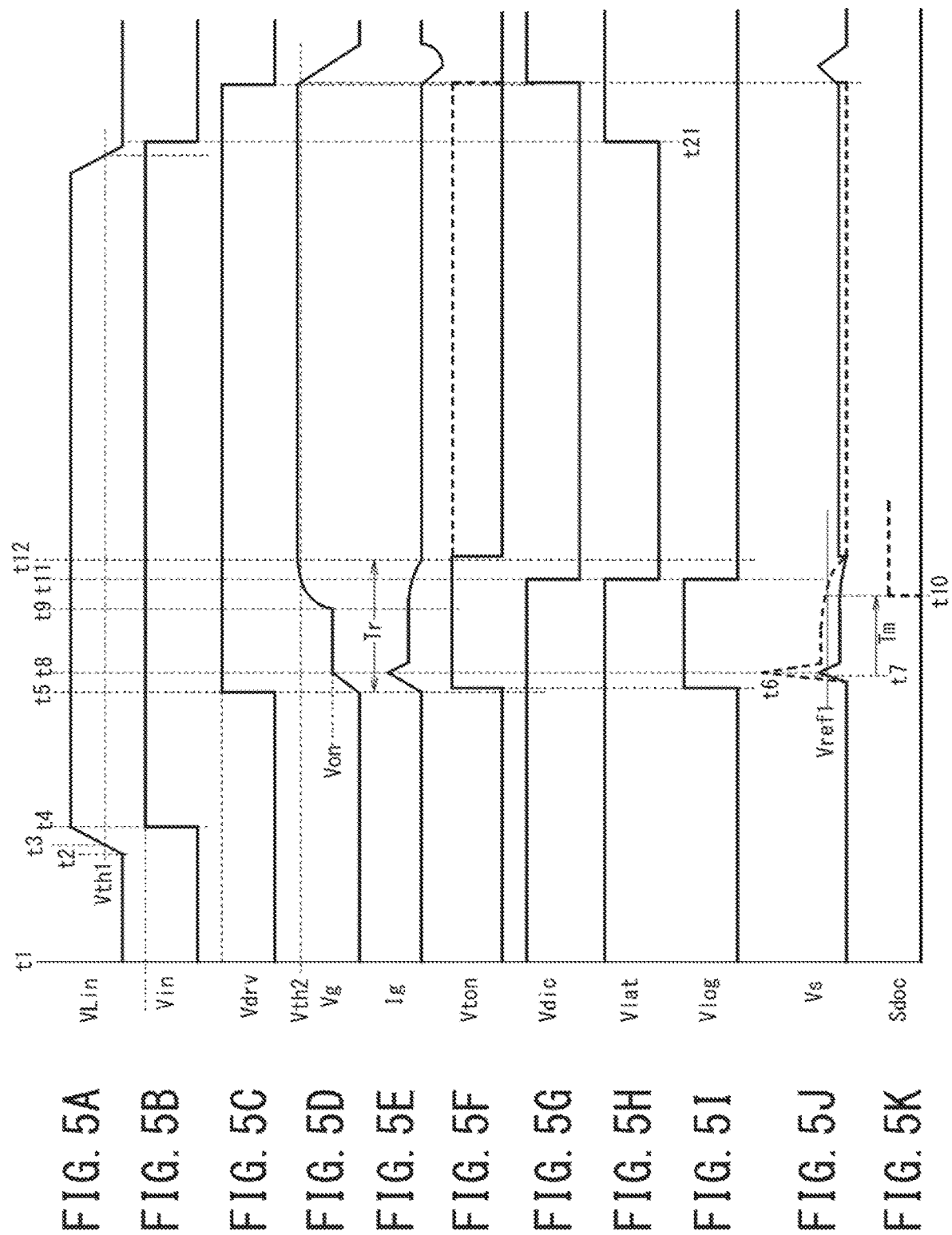
FIGS. 5A to 5K are signal waveform diagrams used for description of operation of the second embodiment.

According to the second embodiment, the input signal Vin illustrated by FIG. 5B output from the input circuit 21 is inverted by the NOT circuit 62 and input to the set terminal S of the RS latch circuit 61. In addition, the voltage determination signal Vdic illustrated by FIG. 5G output from the voltage determination unit 41 is input to the reset terminal R of the RS latch circuit 61 via the NOT circuit 63.

Thus, the RS latch circuit 61 is preferentially set at a falling edge of the input signal Vin, and reset at a falling edge of the voltage determination signal Vdic. As a result, the latch output Vlat output from the output terminal Q of the RS latch circuit 61 is preferentially inverted from low level to high level at a time point t21 when the input signal Vin falls, as illustrated in FIG. 5H.

Since the latch output Vlat of the RS latch circuit 61 is input to the logical product circuit 42a, the logical product signal Vlog of the logical product circuit 42a is maintained at low level during a period from the time point t11 up to the time point t21, regardless of the states of the current detection signal Vton and the voltage determination signal Vdic.

Accordingly, during the period from the time point t11 up to the time point t21, the voltage level adjustment unit 42 maintains the current detection voltage Vs at high voltage level.

Meanwhile, the current detection unit 31 detects the potential difference between both ends of the first current detection resistor Rig by the current detection comparator 31a, and uses the comparison output as the current detection signal Vton. When the drive voltage Vdrv as the output of the drive circuit 22 is at high level, current constantly flows from the drive circuit 22 to the reference potential via the voltage detection unit 32a, and actually, the potential difference between both ends of the first current detection resistor Rig does not become completely zero. Due to this, depending on voltage balancing, the timing of the ending of the transient period may not be able to be detected at the timing when the gate voltage Vg and the gate current Ig are saturated.

Thus, when the current detection comparator 31a cannot detect the timing of the ending of the transient period, the current detection signal Vton is maintained at high level even after the gate current Ig returns to zero at the time point t12 and the transient period ends, as illustrated by a broken line in FIG. 5F.

As described above, when the current detection signal Vton continues to be at high level even after the time point t12, the voltage determination signal Vdic of the voltage determination unit 41 is inverted from low level to high level if a noise having a long low-level interval, such as a thunder surge, an ESD surge, or radiated electromagnetic noise, is superimposed on the input signal Vin or the gate terminal g after the time point t12 when the gate voltage Vg is saturated.

As a result, the logical product signal Vlog of the logical product circuit 42a of the voltage level adjustment unit 42 goes to high level, whereby the current detection voltage Vs continues to be in the state adjusted to low level although it is not the transient state, thus hindering appropriate overcurrent detection.

However, the second embodiment provides the RS latch circuit 61. The RS latch circuit 61 is set at the rising edge of the input signal Vin, and reset at the time point when the gate voltage Vg reaches the threshold voltage Vth2. The latch output Vlat of the RS latch circuit 61, as with the current detection signal Vton and the voltage determination signal Vdic, is input to the logical product circuit 42a, thereby enabling prevention of malfunction of the voltage level adjustment unit 42 due to noise or the like.

According to the second embodiment, the resistor Ria of the second current detection resistor 42b of the voltage level adjustment unit 42 is omitted, and the second current detection resistor 42b is formed by a parallel circuit including the resistor Rib and the switch element SW2. Thus, when the switch element SW2 is in the off-state, voltage drop is caused to occur by a high resistance value of the resistor Rib, whereas when the switch element SW2 is in the on-state, the resistor Rib is bypassed by the switch element SW2, and an on-resistance of the switch element SW2 can be readily used as a low resistance value.

Figure 6:
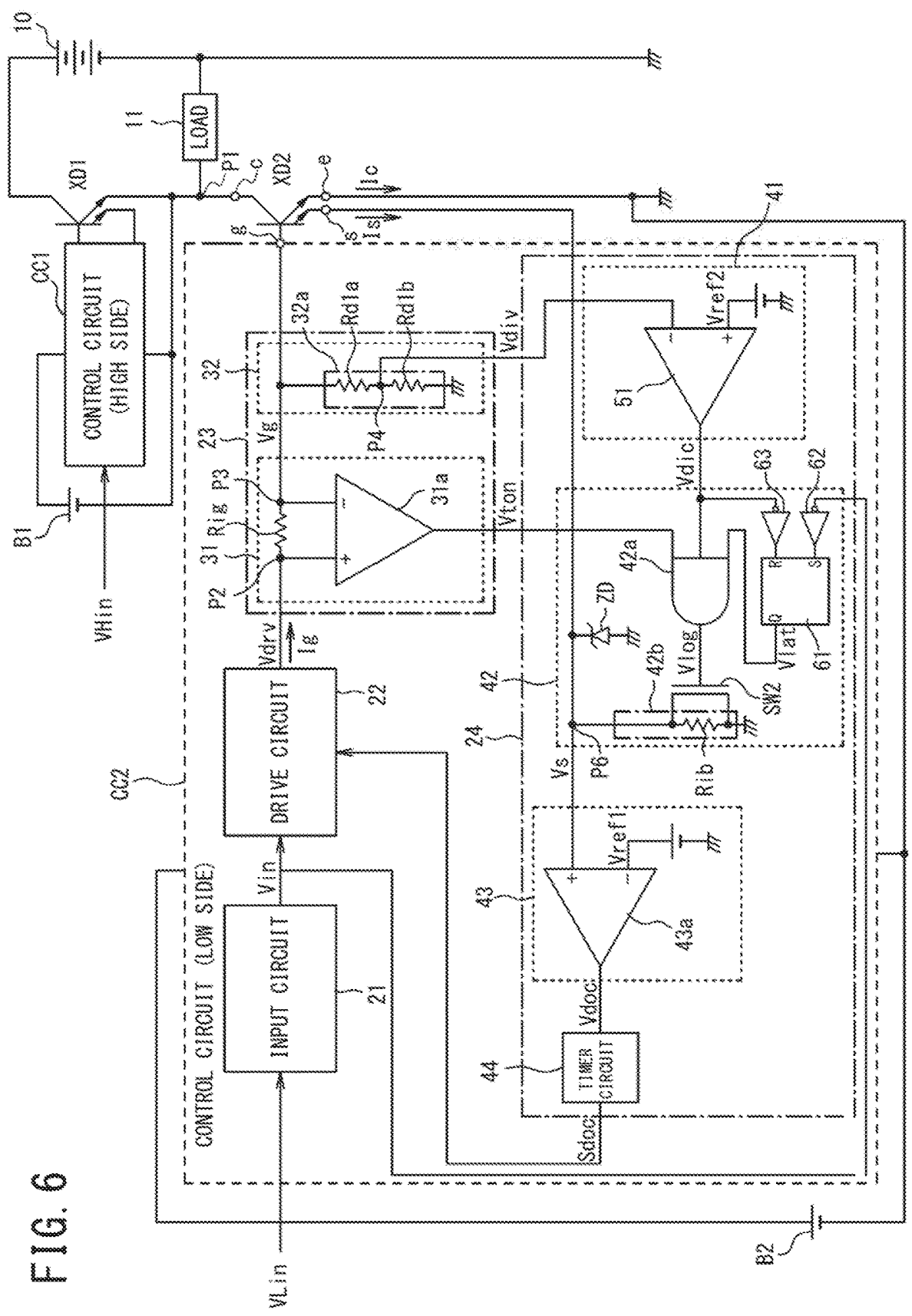
FIG. 6 is a circuit diagram illustrating a modification of the second embodiment.

In addition, even in the second embodiment, the voltage determination unit 41 has been described to include the resistor Rdic and the switch element SW1. However, the voltage determination unit 41 is not limited to the structure, and may be formed as illustrated in FIG. 6. Specifically, as the voltage determination unit 41, the voltage determination comparator 51 may be applied that is configured to compare the divided voltage Vdiv of the voltage divider circuit 32a with the reference voltage Vref2 (corresponding to the divided voltage at the time point when the gate voltage Vg reaches 12V). In this case, the divided voltage Vdiv is input to the inverting terminal of the voltage determination comparator 51, and the reference voltage Vref2 is input to the non-inverting terminal thereof. In this manner, the voltage determination comparator 51 outputs, to the voltage level adjustment unit 42, the voltage determination signal Vdic at high level when the divided voltage Vdiv is equal to or less than the reference voltage Vref2, and the voltage determination signal Vdic at low level when the divided voltage Vdiv exceeds the reference voltage Vref2.

Accordingly, the same voltage determination signal Vdic as in the second embodiment described above can be produced by the voltage determination comparator 51.

Figure 7:
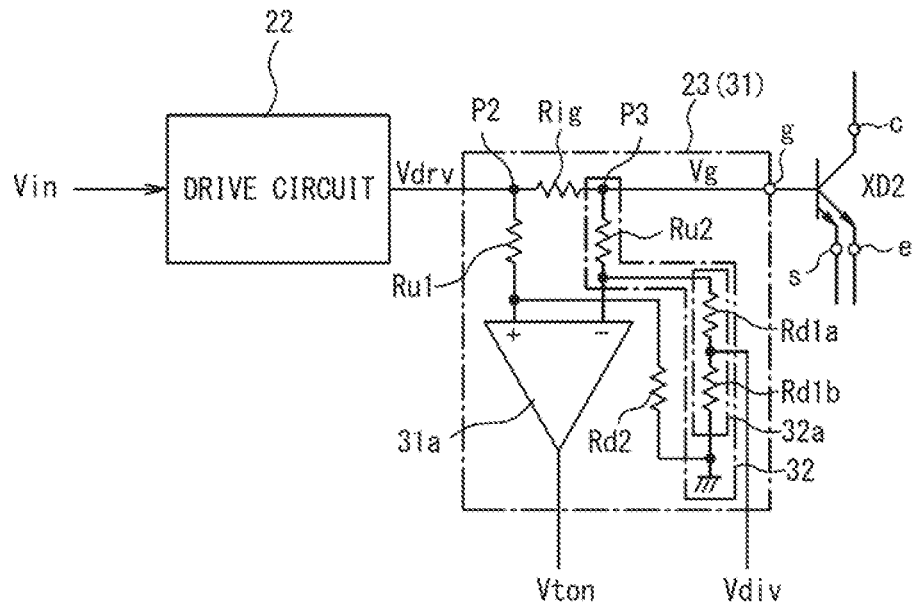
FIG. 7 is a circuit diagram illustrating a modification of a gate current/voltage detection unit applicable to the invention.

Additionally, the first and second embodiments have described the case in which the voltage detection unit 32 is formed by the voltage divider circuit 32a to divide the gate voltage Vg, but not limited thereto. The current detection unit 31 and the voltage detection unit 32 can also be formed as illustrated in FIG. 7.

Specifically, resistors Ru1 and Ru2 are respectively connected between both ends of the first current detection resistor Rig of the current detection unit 31 and the non-inverting input terminal and the inverting input terminal of the current detection comparator 31a. In addition, resistors Rd1a and Rd1b forming the voltage divider circuit 32a are connected between a connection point between the resistor Ru2 and the inverting input terminal of the current detection comparator 31a and ground, and a resistor Rd2 is connected between a connection point between the resistor Ru1 and the non-inverting input terminal of the current detection comparator 31a and ground. Then, the divided voltage Vdiv is output from a connection point between the resistors Rd1a and Rd1b forming the voltage divider circuit 32a to the voltage determination unit 41. Herein, it is preferable to apply resistance elements having a large resistance value (from a few hundred kilo-ohms to a few mega-ohms) so that resistance values of the resistors Rut, Ru2, Rd1a, Rd1b, and Rd2 do not affect a current flowing to the first current detection resistor Rig. Note that, in this structure, the gate current/voltage detection unit 23 and the current detection unit 31 are the same.

In this structure, by changing a voltage division ratio Rd2/(Ru1+Ru2) and a resistance ratio (Rd1a+Rd1b)/(Ru2+Rd1a+Rd1b) of the resistors connected through between both ends of the first current detection resistor Rig and the non-inverting input terminal and the inverting input terminal of the current detection comparator 31a, a difference is made between the input voltages of the current detection comparator 31a, so that a steady output can be obtained even when the drive voltage Vdrv and the gate voltage Vg at both ends of the first current detection resistor Rig are equal (Vdrv=Vg). Thus, the operation of the current detection comparator 31a can be stabilized.

Additionally, the first and second embodiments have described the case in which the gate voltage Vg of the gate terminal g side of the voltage-controlled semiconductor element XD2 in the first current detection resistor Rig is divided by the voltage divider circuit 32a, and the divided voltage Vdiv is output to the voltage determination unit 41.

Figure 8:
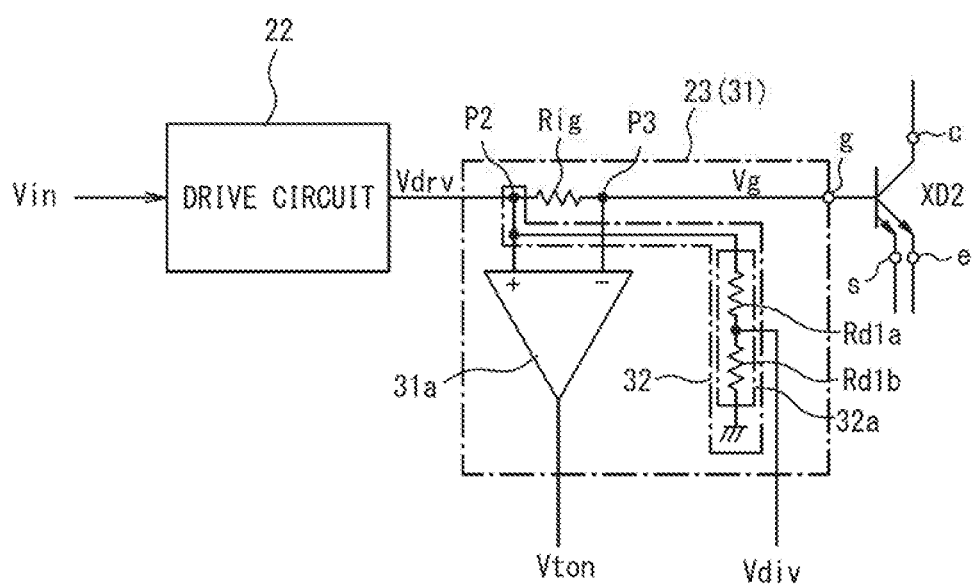
FIG. 8 is a circuit diagram illustrating another modification of the gate current/voltage detection unit applicable to the invention.
Figure 9:
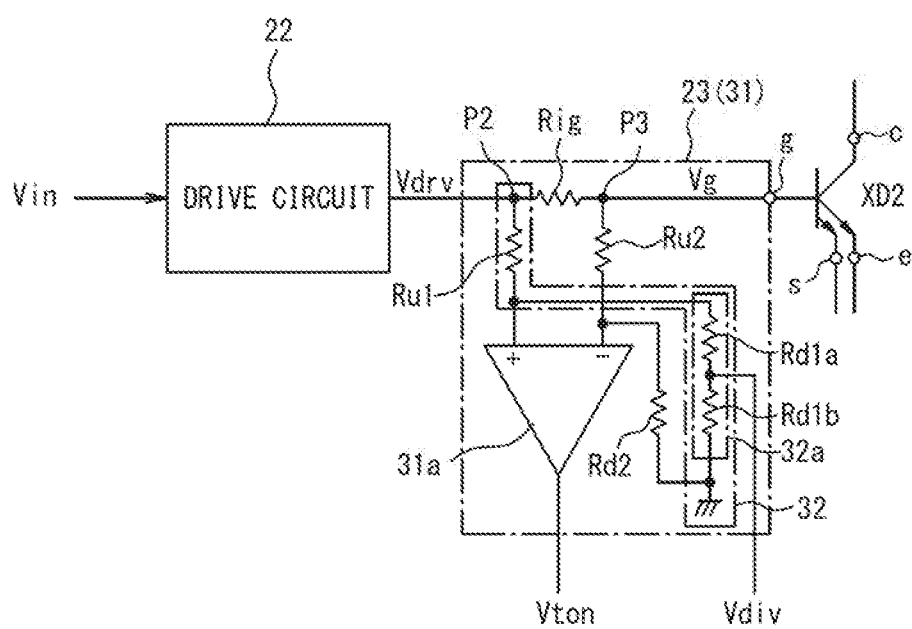
FIG. 9 is a circuit diagram illustrating still another modification of the gate current/voltage detection unit applicable to the invention.

However, the present invention is not limited thereto, and structures as illustrated in FIGS. 8 and 9 may also be possible.

Specifically, in FIG. 8, the voltage divider circuit 32a of the voltage detection unit 32 in the first and second embodiments is configured to divide the drive voltage Vdrv of the drive circuit 22 side in the first current detection resistor Rig.

On the other hand, in FIG. 9, the arrangement of the current detection unit 31 and the voltage detection unit 32 of FIG. 7 is changed so that the drive voltage Vdrv is divided by the resistor Ru1 and the voltage divider circuit 32a and supplied to the non-inverting input terminal of the current detection comparator 31a, and the gate voltage Vg is divided by the resistor Ru2 and the resistor Rd2 and supplied to the inverting input terminal of the current detection comparator 31a.

The voltage detection unit 32 of each of FIGS. 8 and 9 is configured to divide the drive voltage Vdrv in place of the gate voltage Vg to produce the divided voltage Vdiv. The reason for this is that since the resistance value of the first current detection resistor Rig is small and ignorable as compared to an output impedance of the drive circuit 22, the voltage waveform of the drive voltage Vdrv is close to the voltage waveform of the gate voltage Vg. Accordingly, the voltage of the drive voltage Vdrv in place of the gate voltage Vg is detected and compared with the threshold voltage Vth2, thereby enabling determination of the ending of the transient state.

In addition, while the first and second embodiments have described the current detection circuit and the current detection method of the low side control circuit CC2, the same current detection circuit and current detection method can also be applied to the high side control circuit CC1.

REFERENCE SIGNS LIST

XD1, XD2: Voltage-controlled semiconductor element
c: Collector terminal
e: Emitter terminal
g: Gate terminal
s: Current detection terminal
CC1, CC2: Control circuit
21: Input circuit
22: Drive circuit
23: Gate current/voltage detection unit
Rig: First current detection resistor
24: Sense current detection circuit
31: Current detection unit
31a: Current detection comparator
32: Voltage detection unit
32a: Voltage divider circuit
41: Voltage determination unit
Rdic: Resistor
SW1: Switch element
42: Voltage level adjustment unit
42a: Logical product circuit
42b: Second current detection resistor
Rd1a, Rd1b: Voltage divider resistor
SW2: Switch element
43: Overcurrent detection unit
43a: Overcurrent determination comparator
44: Timer circuit
51: Voltage determination comparator
61: RS latch circuit

The invention claimed is:

1. A current detection circuit of a semiconductor element comprising:
a current detection unit configured to detect a potential difference between both ends of a first current detection resistor, the first current detection resistor being interposed between a control terminal of a voltage-controlled semiconductor element and a drive circuit, the voltage-controlled semiconductor element including a current detection terminal;
a voltage detection unit configured to detect a voltage at one of the both ends of the first current detection resistor;
a voltage determination unit configured to determine whether or not a detection voltage output from the voltage detection unit is equal to or more than a first threshold voltage;
a voltage level adjustment unit configured to adjust a voltage level of a current detection voltage of the current detection terminal by a logical product signal of at least a current detection signal of the current detection unit and a voltage determination signal of the voltage determination unit; and
an overcurrent detection unit configured to output an overcurrent detection signal when the current detection voltage adjusted by the voltage level adjustment unit is equal to or more than a second threshold voltage.

2. The current detection circuit of the semiconductor element according to claim 1, wherein the current detection unit is formed by a comparator having an inverting input terminal and a non-inverting input terminal individually connected to the both ends of the first current detection resistor.

3. The current detection circuit of the semiconductor element according to claim 2, wherein the voltage detection unit includes a voltage divider circuit connected between either one of the both ends of the first current detection resistor and ground, a divided voltage of the voltage divider circuit being output to the voltage determination unit.

4. The current detection circuit of the semiconductor element according to claim 3, wherein the voltage divider circuit includes a series circuit of a first voltage divider resistor and a second voltage divider resistor, the first voltage divider resistor being connected to either one of the both ends of the first current detection resistor, and the second voltage divider resistor being connected to the ground to output a divided voltage from between the first voltage divider resistor and the second voltage divider resistor.

5. The current detection circuit of the semiconductor element according to claim 4, wherein the voltage divider circuit further includes a first voltage ratio adjustment resistor connected between a drive circuit side of the first current detection resistor and the non-inverting input terminal of the comparator, a second voltage ratio adjustment resistor connected between a control terminal side of the first current detection resistor and the inverting input terminal of the comparator, and a third voltage divider resistor connected between the non-inverting input terminal and the ground, the first voltage divider resistor and the second voltage divider resistor being connected in series between the inverting input terminal and the ground.

6. The current detection circuit of the semiconductor element according to claim 4, wherein the voltage divider circuit further includes a first voltage ratio adjustment resistor connected between a drive circuit side of the first current detection resistor and the non-inverting input terminal of the comparator, a second voltage ratio adjustment resistor connected between a control terminal side of the first current detection resistor and the inverting input terminal of the comparator, and a third voltage divider resistor connected between the inverting input terminal and the ground, the first voltage divider resistor and the second voltage divider resistor being connected in series between the non-inverting input terminal and the ground.

7. The current detection circuit of the semiconductor element according to claim 3, wherein the voltage determination unit includes a resistor having one end connected to a DC power supply and a switch element connected between the other end of the resistor and ground, the first threshold voltage being a threshold voltage of the switch element, the divided voltage being input to a control terminal of the switch element, and the voltage determination signal being output from between the resistor and the switch element to the voltage level adjustment unit.

8. The current detection circuit of the semiconductor element according to claim 3, wherein the voltage determination unit is formed by a comparator configured to compare the divided voltage of the voltage divider circuit with the first threshold voltage.

9. The current detection circuit of the semiconductor element according to claim 1, wherein the voltage level adjustment unit includes a second current detection resistor connected between the current detection terminal and ground, a switch element configured to adjust a resistance value of the second current detection resistor, and a logical product circuit configured to drive the switch element, the current detection signal of the current detection unit and the voltage determination signal output from the voltage determination unit being input to an input side of the logical product circuit, and a section between the second current detection resistor and the current detection terminal being connected to the overcurrent detection unit.

10. The current detection circuit of the semiconductor element according to claim 9, wherein the second current detection resistor includes a plurality of resistors connected in series, the switch element being connected in parallel to at least one of the plurality of resistors.

11. The current detection circuit of the semiconductor element according to claim 9, wherein the second current detection resistor is formed by a single resistor, the switch element being connected in parallel to the single resistor.

12. The current detection circuit of the semiconductor element according to claim 11, wherein the voltage level adjustment unit includes a latch circuit configured to be set when an input signal input to the drive circuit goes to low level, and to be reset when the detection voltage output from the voltage detection unit is equal to or more than the first threshold voltage, the voltage level adjustment unit outputting a logical product signal of the current detection signal, the voltage determination signal, and an output signal of the latch circuit to the switch element.

13. A current detection method of a semiconductor element, comprising:
detecting, by a current detection unit, a gate current flowing through a first current detection resistor interposed between a gate terminal of a voltage-controlled semiconductor element and a drive circuit, the voltage-controlled semiconductor element including a current detection terminal, and detecting a gate voltage between the first current detection resistor and the gate terminal by a voltage detection unit; and
during a period from a time point when the gate current is detected up to a time point when the gate voltage exceeds a threshold value, suppressing a voltage level of a current detection voltage of the current detection terminal to suppress erroneous detection of an overcurrent.

14. The current detection method of the semiconductor element according to claim 13, further comprising:

during the period from the time point when the gate current is detected up to the time point when the gate voltage exceeds the threshold value, outputting an overcurrent detection signal at a high level when the current detection voltage is greater than another threshold value, maintaining a current drive signal of the drive circuit, and starting a timer; and setting the drive circuit to an inactive state based on whether the overcurrent detection signal is at the high level a predetermined duration of time after the timer is started.

15. The current detection method of the semiconductor element according to claim 13, further comprising:

during the period from the time point when the gate current is detected up to the time point when the gate voltage exceeds the threshold value, changing a resistance value of a second current detection resistor, interposed between the current detection terminal and ground, to suppress the voltage level of the current detection voltage.

16. A current detection method of a semiconductor element, comprising:

detecting, by a current detection unit, a gate current flowing through a first current detection resistor interposed between a gate terminal of a voltage-controlled semiconductor element and a drive circuit, the voltage-controlled semiconductor element including a current detection terminal, and detecting a gate voltage between the first current detection resistor and the gate terminal by a voltage detection unit;

during a period from a time point when the gate current is detected up to a time point when the gate voltage exceeds a threshold value, suppressing a voltage level of a current detection voltage of the current detection terminal to suppress erroneous detection of an overcurrent; and stopping suppressing the voltage level of the current detection voltage during a period from a time point when the gate voltage exceeds the threshold value up to a time point when an input signal input to the drive circuit falls.

* * * * *